(12) United States Patent
Suh et al.

(10) Patent No.: US 7,378,908 B2
(45) Date of Patent: May 27, 2008

(54) VARIABLE GAIN DIFFERENTIAL AMPLIFIER, AND VARIABLE DEGENERATION IMPEDANCE CONTROL DEVICE AND METHOD FOR USE IN THE SAME

(75) Inventors: Chun-deok Suh, Yongin-si (KR); Hoon-tae Kim, Yongin-si (KR); Jung-eun Lee, Seongnam-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 157 days.

(21) Appl. No.: 11/349,171

(22) Filed: Feb. 8, 2006

(65) Prior Publication Data

US 2006/0186961 A1 Aug. 24, 2006

(30) Foreign Application Priority Data

Feb. 18, 2005 (KR) .................... 10-2005-0013788

(51) Int. Cl.
*H03F 3/45* (2006.01)
(52) U.S. Cl. ...................... 330/254; 330/283
(58) Field of Classification Search ................. 330/283
See application file for complete search history.

(56) References Cited

U.S. PATENT DOCUMENTS 5,642,078 A * 6/1997 Navabi et al. .............. 330/253

FOREIGN PATENT DOCUMENTS

KR 10-0413182 B1 12/2003

* cited by examiner

*Primary Examiner*—Steven J. Mottola
(74) *Attorney, Agent, or Firm*—Sughrue Mion, PLLC

(57) ABSTRACT

Disclosed are a variable gain differential amplifier, and variable degeneration impedance control device and method for use in the variable gain differential amplifier, which can adjust an amplification gain and ensure linearity. A DC level of a differential signal to be amplified by the amplifier is adjusted according to a control signal to adjust a gain of the amplifier, and the impedance of a variable degeneration impedance part is adjusted according to the differential signal of which the DC level is adjusted. That is, the gain of the differential amplifier is adjusted and the linearity is ensured by varying the impedance of the variable degeneration impedance part using the differential input signal of which the DC level is adjusted.

9 Claims, 8 Drawing Sheets

VARIABLE GAIN DIFFERENTIAL AMPLIFIER, AND VARIABLE DEGENERATION IMPEDANCE CONTROL DEVICE AND METHOD FOR USE IN THE SAME

CROSS-REFERENCE TO RELATED APPLICATIONS

This application claims priority under 35 U.S.C. § 119 from Korean Patent Application No. 2005-13788, filed on Feb. 18, 2005, the entire content of which is incorporated herein by reference.

BACKGROUND OF THE INVENTION

1. Field of the Invention

The invention relates to a variable gain differential amplifier, and variable degeneration impedance control device and method for use in the same, and more particularly, to a variable gain differential amplifier that has both linearity and gain adjustment.

2. Description of the Related Art

A variable gain amplifier (VGA) is an amplifier that can adjust a gain by receiving and amplifying a difference between signals (hereinafter referred to as "differential signal").

Commercialized devices that use variable gain amplifiers may be personal digital assistants (PDAs), mobile communication devices, cellular phones, wireless two-way data communication devices, etc.

Figure 1A:
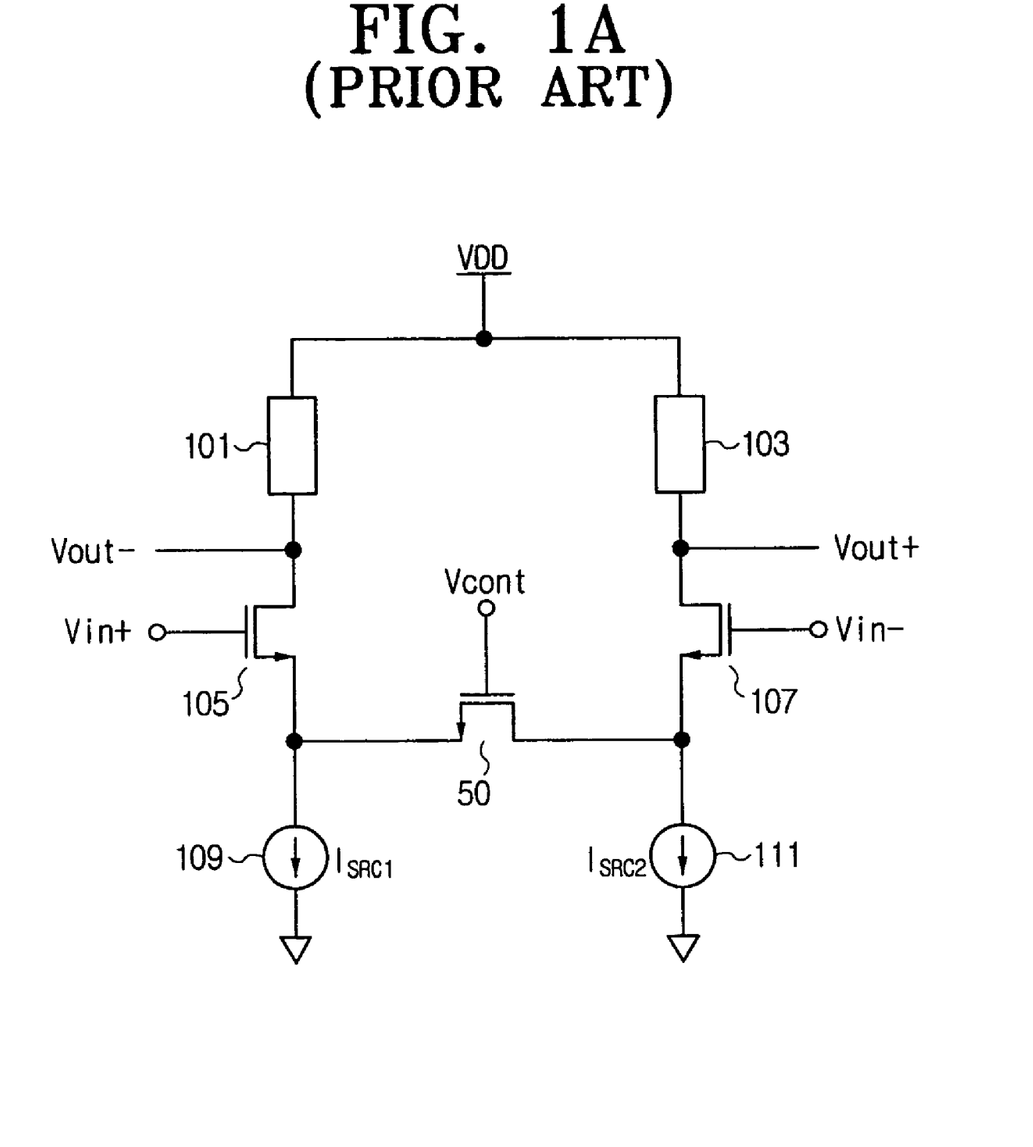
FIG. 1A is a schematic circuit diagram of one conventional differential amplifier.

FIG. 1A is a schematic circuit diagram illustrating an example of a conventional amplifier.

The amplifier shown in FIG. 1A includes loads 101 and 103, amplifying parts 105 and 107, a variable degeneration impedance part 50, and constant-current sources 109 and 111.

The amplifying parts 105 and 107 receive and amplify differential signals Vin+ and Vin−. The loads 101 and 103 are connected between the amplifying parts 105 and 107 and a power supply VDD so as to level potentials of output signals of the amplifying parts. The variable degeneration impedance part 50 varies its impedance value depending on a control signal Vcont inputted thereto.

In the above-described conventional amplifier, an active element such as a metal oxide semiconductor (MOS) is used as the variable degeneration impedance part 50. As is generally known in the art, the MOS has a gate terminal G, a source terminal SOURCE, a drain terminal D and a bulk terminal B. The bulk terminal B is connected to ground, and a control signal for gain adjustment is inputted to the gate terminal G. By adjusting the value of the control signal, a resistance value seen from the source terminal and the drain terminal into the MOS transistor is controlled, and thus a gain level of the amplifier is adjusted.

Figure 2:
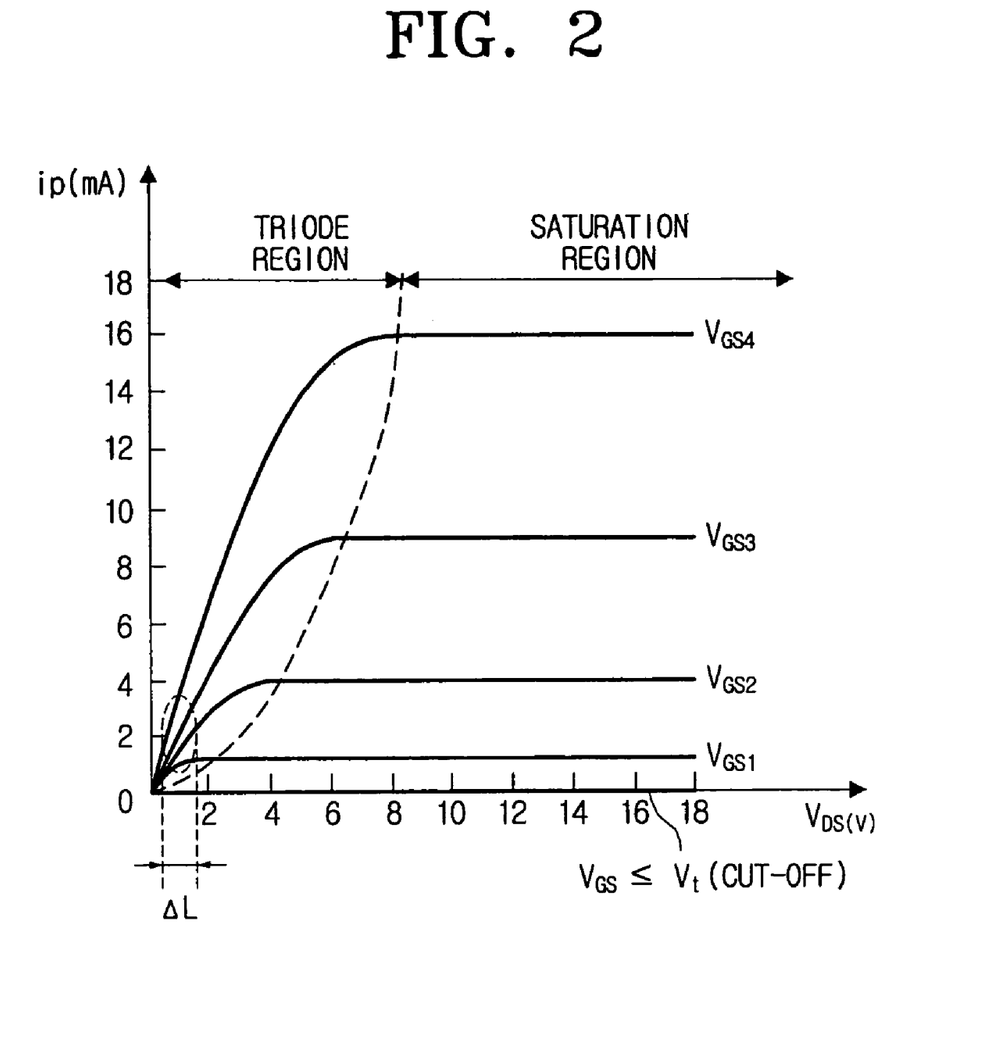
FIG. 2 is a graph illustrating the voltage-current characteristic of a MOS transistor.

The principle of adjusting the gain level of an amplifier using a transistor 50 will now be described with reference to FIG. 2 which illustrates a voltage-current curve of the MOS transistor. According to FIG. 1A, one of four curves shown in FIG. 2 can be selected by adjusting the value of a gate voltage Vcont of the transistor 50, and the resistance value can be adjusted by selecting the value of a drain voltage VDS of the transistor 50. Also, in order to ensure the linearity of the amplifier, the value of the drain voltage VDS of the transistor 50 is selected so that the transistor 50 operates in a triode region near its origin.

The conventional variable gain differential amplifier shown in FIG. 1A has an advantage in that the gain level of the transistor 50 can be adjusted by adjusting the resistance value of the transistor 50 using the voltage Vcont. However, the triode region L, in which the linearity is ensured, is too narrow since it is limited to the vicinity of the origin. Accordingly, if a large signal is applied between the drain and the source, the linearity of the amplifier cannot be ensured. Consequently, the conventional amplifier shown in FIG. 1A can adjust the gain level, but cannot ensure the linearity sufficiently.

Figure 1B:
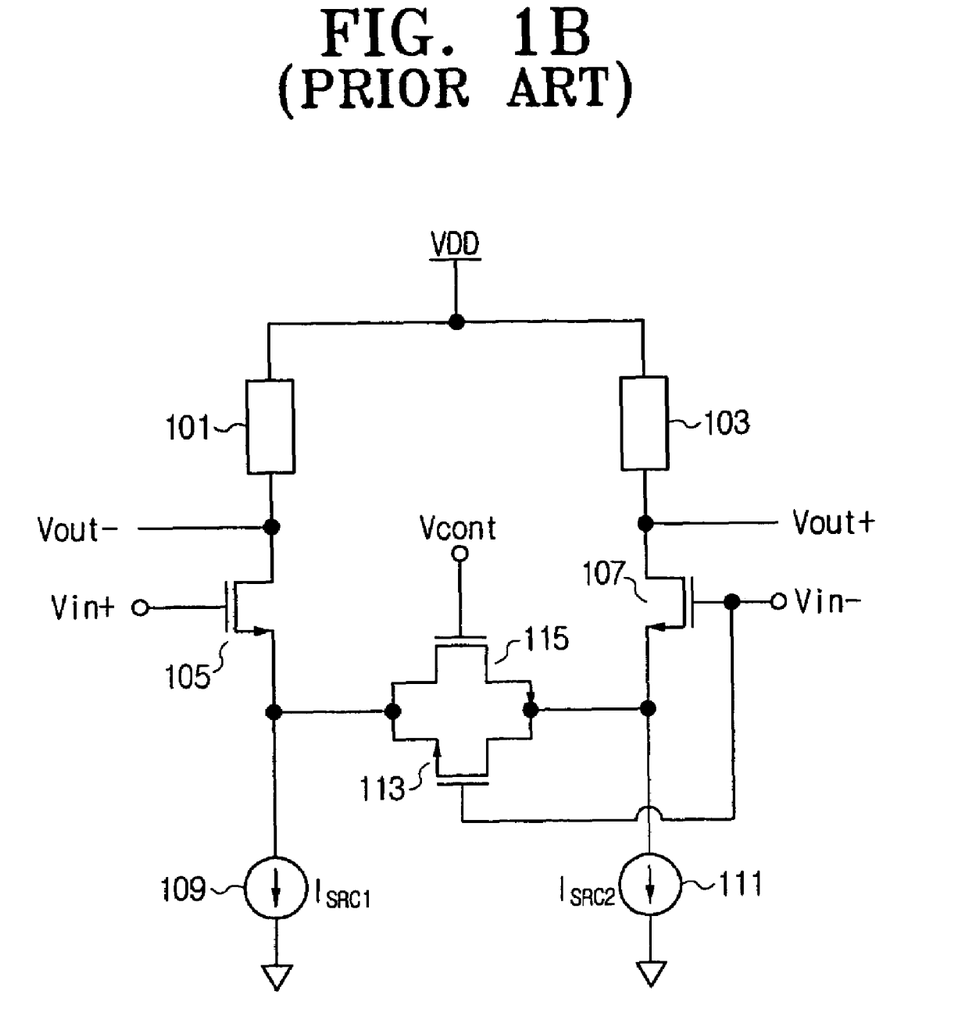
FIG. 1B is a schematic circuit diagram of another conventional differential amplifier.

FIG. 1B shows another example of a conventional amplifier. In this conventional amplifier, two MOS transistors 113 and 115 are used as resistance elements for degeneration. Differential input signals to be amplified are inputted to the gates of the respective transistors 113 and 115, and the resistance values thereof are determined according to the levels of the input signals. Although the resistance values of the respective transistors 113 and 115 are varied depending on the levels of the input signals, the added value of both the resistance values is kept constant. Accordingly, the conventional amplifier shown in FIG. 1B can ensure the linearity, but cannot adjust the gain level since the DC levels of the gain input differential signals are fixed.

SUMMARY OF THE INVENTION

The present invention addresses the above-mentioned drawbacks and other problems associated with the conventional amplifier arrangements. An aspect of the present invention is to provide a variable gain differential amplifier which can adjust the amplification gain and ensure the linearity.

Another aspect of the present invention is to provide a variable degeneration impedance control device for use in a variable gain differential amplifier, which can adjust the amplification gain and ensure the linearity.

Still another aspect of the present invention is to provide a variable degeneration impedance control method for use in a variable gain differential amplifier, which can adjust the amplification gain and ensure the linearity.

The foregoing aforementioned aspects of the present invention are realized by providing a variable gain differential amplifier, according to the present invention, which comprises a variable degeneration impedance part for varying a gain of the variable gain differential amplifier by varying its impedance according to a control signal from outside, and a differential amplification part having a first terminal receiving a differential signal, a second terminal connected to a power supply through a load, and a third terminal connected to the variable degeneration impedance part, wherein the variable degeneration impedance part includes a DC level adjustment unit for adjusting a DC level of the differential signal according to the control signal, and a variable impedance unit where the impedance of the variable impedance unit is adjusted according to the differential signal of which the DC level is adjusted.

The DC level adjustment unit may include an operational amplifier having a receiving terminal for receiving the differential signal, a control signal receiving terminal for receiving the control signal, and an output terminal for outputting a processed differential signal to the variable impedance unit, where the processed differential signal is obtained by adjusting the DC level of the received differential signal.

The DC level adjustment unit may further include a first impedance unit having one end connected to the receiving terminal of the operational amplifier and the other end connected to the first terminal of the first differential amplification part, and a second impedance unit having one end connected to the receiving terminal of the operational amplifier and the other end connected to the output terminal of the operational amplifier.

The variable impedance unit may include first and second transistors, where gate terminals of the first and second transistors are connected to the DC level adjustment unit, and drain and source terminals of the first and second transistors are connected to a third terminal of the differential amplification part.

In another aspect of the present invention, there is provided a variable degeneration impedance control device for use in a variable gain differential amplifier, which comprises a DC level adjustment unit for adjusting a DC level of a differential signal to be amplified by the amplifier according to a control signal to adjust a gain of the amplifier, and a variable impedance unit which is connected to the amplifier and the impedance of which is adjusted according to the differential signal of which the DC level is adjusted, wherein the gain of the variable gain differential amplifier is varied by adjusting the control signal.

The DC level adjustment unit may include an operational amplifier having a receiving terminal for receiving the differential signal, a control signal receiving terminal for receiving the control signal, and an output terminal for outputting the differential signal, of which the DC level is adjusted, to the variable impedance unit.

The DC level adjustment unit may further include a first impedance unit having one end connected to the receiving terminal of the operational amplifier and the other end connected to the first terminal of the first differential amplification part, and a second impedance unit having one end connected to the receiving terminal of the operational amplifier and the other end connected to the output terminal of the operational amplifier.

The variable impedance unit may include first and second transistors, wherein gate terminals of the first and second transistors are connected to the DC level adjustment unit, and drain and source terminals of the first and second transistors are connected to a third terminal of the differential amplification part.

In still another aspect of the present invention, there is provided a variable degeneration impedance control method for adjusting impedance of a variable degeneration impedance part for use in a variable gain differential amplifier, which comprises adjusting a DC level of a differential signal to be amplified by the amplifier according to a control signal, providing the differential signal of which the DC level is adjusted in the DC level adjustment operation to the variable degeneration impedance part, and adjusting the impedance of the variable degeneration impedance part by adjusting the control signal.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF THE EXEMPLARY EMBODIMENTS

Certain exemplary embodiments of the present invention will be described in greater detail with reference to the accompanying drawings.

In the following description, same drawing reference numerals are used for the same elements even in different drawings. The matters defined herein are described at a high-level of abstraction to provide a comprehensive yet clear understanding of the invention. It is also to be noted that it will be apparent to those ordinarily skilled in the art that the present invention is not limited to the description of the exemplary embodiments provided herein.

Figure 3:
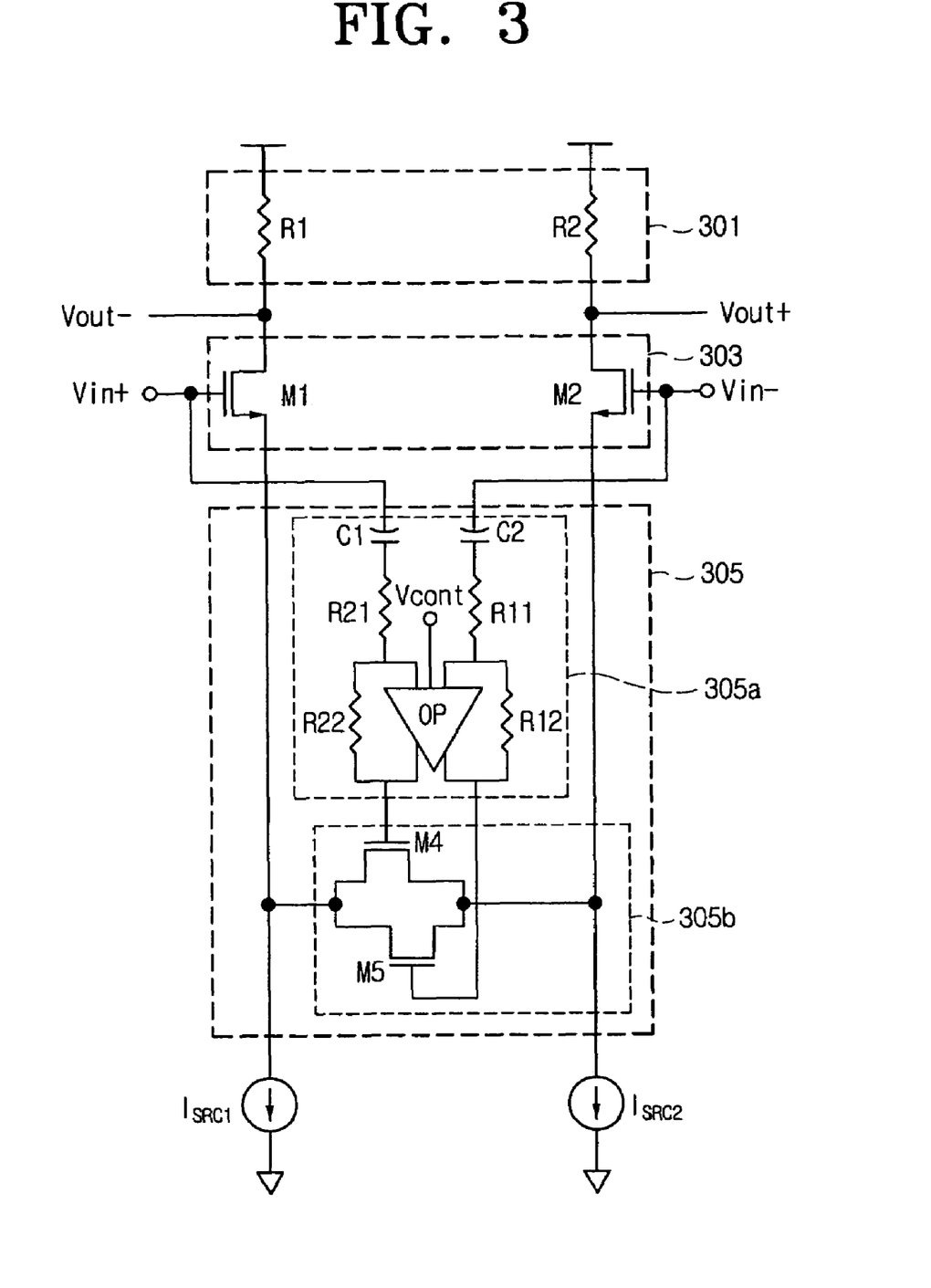
FIG. 3 is a schematic circuit diagram of a variable gain differential amplifier according an exemplary embodiment of the present invention.

FIG. 3 is a schematic circuit diagram of a variable gain differential amplifier according an exemplary embodiment of the present invention.

Referring to FIG. 3, the variable gain differential amplifier includes a load 301, a differential amplifying part 303, and a variable degeneration impedance part 305.

The variable amplifying part 303 has input terminals for receiving differential signals Vin+ and Vin−, output terminals Vout+ and Vout− connected to a power supply (not illustrated) through the load 301, and terminals connected to the variable degeneration impedance part 305.

In this exemplary embodiment, the differential amplifying part 303 has two MOS transistors M1 and M2. Gate terminals of the respective MOS transistors receive differential signals, drain terminals thereof are connected to the power supply through the load 301, and source terminals thereof are connected to the variable degeneration impedance part 305. The drain terminals are used as terminals for outputting amplified signals.

To the gate terminals of the transistors M1 and M2, a pair of signals having the same magnitude and a phase difference of 180° from each other are inputted. The drain terminals thereof have a constant potential through the power supply, and the potential of the drain terminals affects a swing value of the amplified signals because the maximum swing value of the output signal cannot be larger than the potential value of the drain terminal.

Generally, it is preferable, but not necessary, that the maximum swing value of the signal outputted from the amplifier becomes higher. For this, a push-pull configuration may be adopted in which a pair of PMOS transistors are disposed between the load 301 and the power supply (not illustrated). If the push-pull configuration is adopted, a large output voltage swing width can be obtained even by a small supply voltage.

One side of the load 301 is connected to the power supply, and the other side thereof is connected to the output terminal of the differential amplifying part 303, so that the load affects the amplification gain of the differential amplifying part. In the exemplary embodiment of the present invention, the load 301 includes resistors R1 and R2. However, bipolar junction transistors (BJTs) or field effect transistors (FETs) such as MOS transistors may also be adopted as the load 301.

Also, in the exemplary embodiment of the present invention, the load 301 is composed of resistors having a constant resistance. However, variable resistors (or impedances) may be adopted as the load 301 because the gain of the amplifier may be varied depending on the resistance (or impedance) value of the load 301.

The variable degeneration impedance part 305 has a negative feedback loop formed at its input terminals, and thus the linearity of the signals outputted from the differential amplifying unit 303 is increased although the magnitude thereof is reduced.

The transistors constituting the differential amplifying part 303 are nonlinear devices. Accordingly, if signals over a specified magnitude are inputted to the transistors, unwanted signals (i.e., harmonic signals) as well as signal distortion may be produced. If the negative feedback loop is formed at the input terminals of the differential amplifying part 303 by using the variable degeneration impedance part 305, the magnitude of the input signals of the differential amplifying part 303 is decreased, and this causes the linearity of the signals outputted from the differential amplifying part 303 to be increased.

The impedance value of the variable degeneration impedance part 305 affects the amplification gain of the differential amplifying part together with the impedance value of the load 301. This relation may be expressed by:

amplification gain≈(impedance value of load 301)/ (impedance value of variable degeneration impedance part 305).

The variable degeneration impedance part 305 includes a DC level adjustment unit 305a for adjusting the DC level of the differential input signal in accordance with the control signal, and a variable impedance unit 305b which varies the impedance value depending on the input signal where the DC level of the input signal is adjusted by the DC level adjustment unit.

In the exemplary embodiment of the present invention, the DC level adjustment unit 305a has capacitors C1 and C2, resistors R21, R22, R11 and R12, and an operational amplifier OP. The operational amplifier OP can vary the DC level of the input signal. The capacitors C1 and C2 can eliminate the DC component from the signals inputted to the operational amplifier.

The operational amplifier OP has a terminal for receiving differential input signals, a terminal for receiving a control signal Vcont, and a terminal for outputting the differential input signals of which the DC level is varied.

The differential input signals are inputted to the input terminals of the operational amplifier OP through the capacitors C1 and C2 and the resistors R21 and R11.

The operational amplifier varies the DC level of the differential input signals to output the resultant signals through its output terminals according to the input control signal. The output signals are fed back to the input terminals through the resistors R22 and R12.

The variable impedance unit 305b is composed of two NMOS transistors M4 and M5. The signals outputted from the DC level adjustment unit 305a are inputted to the gate terminals of the respective transistors M4 and M5. The source terminal of the transistor M4 is connected to the drain terminal of the transistor M5, and the drain terminal of the transistor M4 is connected to the source terminal of the transistor M5. Also, the source terminal of the transistor M4 and the drain terminal of the transistor M5 are connected to the transistor M1, and the drain terminal of the transistor M4 and the source terminal of the transistor M5 are connected to the transistor M2.

In the exemplary embodiment, the variable gain differential amplifier further includes power sources ISRC1 and ISRC2 for keeping its bias current constant. The power sources ISRC1 and ISRC2 enable the bias current to constantly flow through the transistors M1, M2, M4, and M5.

Figure 4:
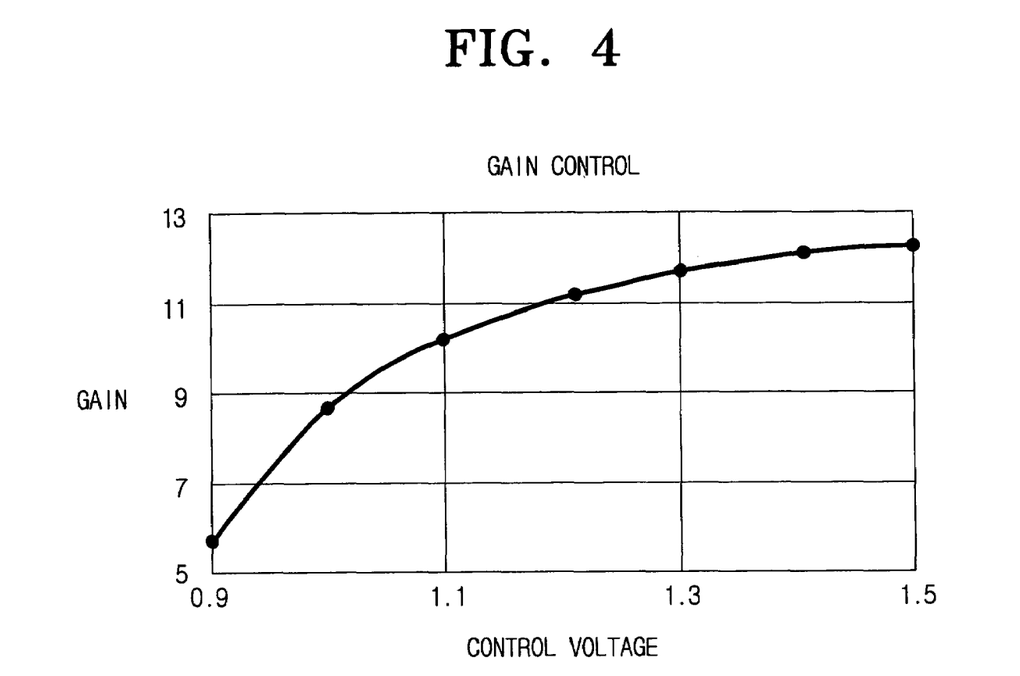
FIG. 4 is a graph illustrating the gain control of a variable gain differential amplifier according to an exemplary embodiment of the present invention.

FIG. 4 is a graph illustrating the gain control of a variable gain differential amplifier according to an exemplary embodiment of the present invention shown in FIG. 3.

As can be seen from FIGS. 3 and 4, the amplification gain is varied by varying the control voltage inputted to the variable degeneration impedance part 305. That is, the amplification gain is varied in the range of 6 to 12 dB.

Figure 5A:
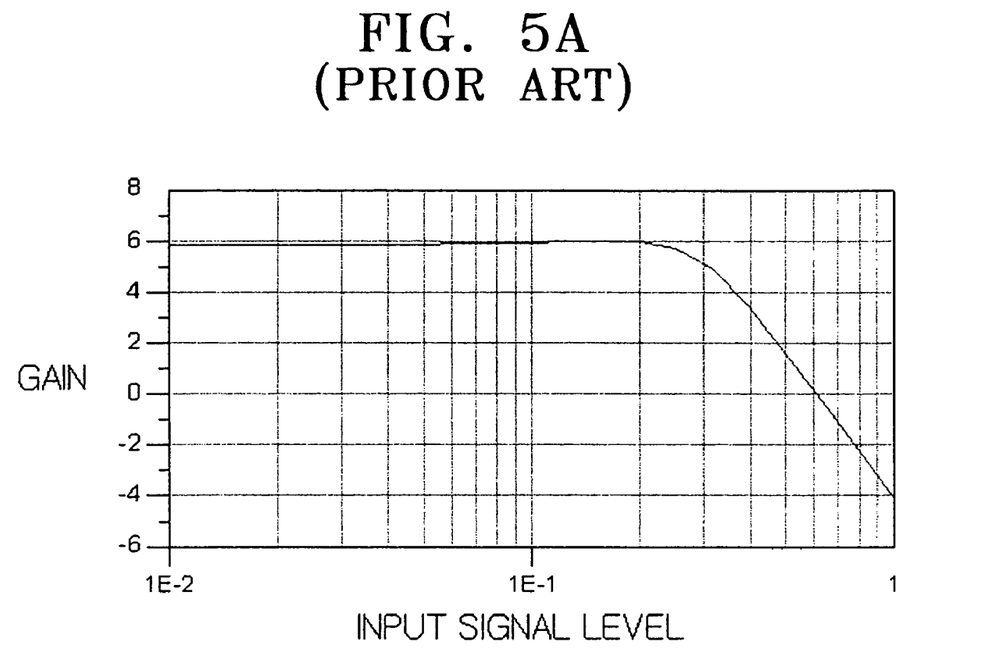
FIG. 5A is a graph illustrating an amplification gain and a linear operation region according to an input signal level of the conventional amplifier of FIG. 1B.
Figure 5B:
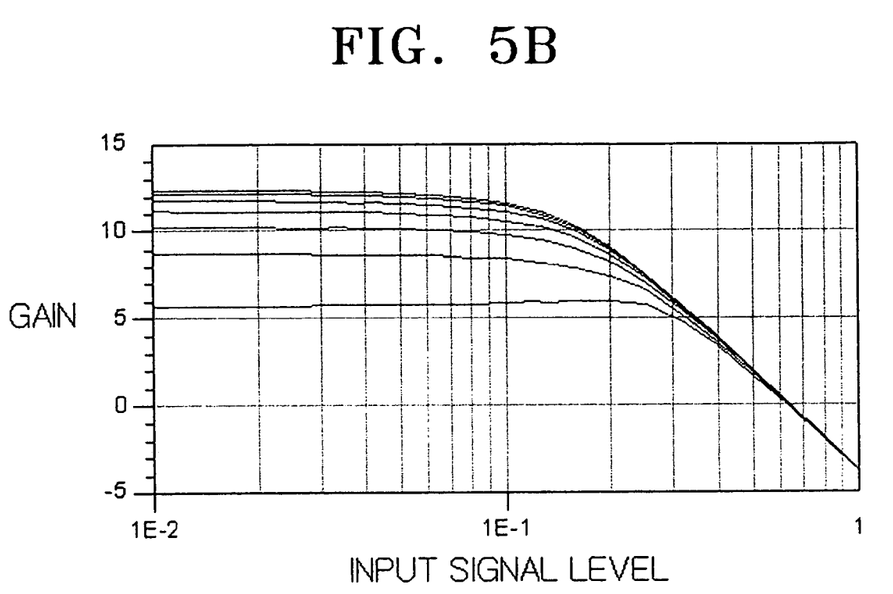
FIG. 5B is a graph illustrating an amplification gain and a linear operation region according to an input signal level of a variable gain differential amplifier according to an exemplary embodiment of the present invention.

FIG. 5A is a graph illustrating an amplification gain and a linear operation region according to an input signal level of a conventional amplifier of FIG. 1B. FIG. 5B is a graph illustrating an amplification gain and a linear operation region according to an input signal level of a variable gain differential amplifier according to an embodiment of the present invention.

As can be seen from FIG. 5A, the differential amplifier in FIG. 1B provides a constant amplification gain until the input signal reaches about 0.2 V. However, since its gain cannot be adjusted, the differential amplifier can only provide the constant gain.

As can be seen from FIG. 5B, the differential amplifier according to the present invention can ensure both the variance and the linearity of the gain. Generally, if the input signal is small, it is preferable, but not necessary, that the gain range is large. However, if the input signal is large, it is important to ensure the linearity rather than the magnitude of the input signal. As can be seen from FIG. 5B, in the case of the large amplification gain, the linearity is ensured to about 0.1 V, while in the case of the small amplification gain, the linearity is ensured to about 0.2 V.

In the exemplary embodiments of the present invention described above, the differential amplifier includes the NMOS transistors. However, it may include PMOS transistors or other active devices such as BJTs.

Figure 6:
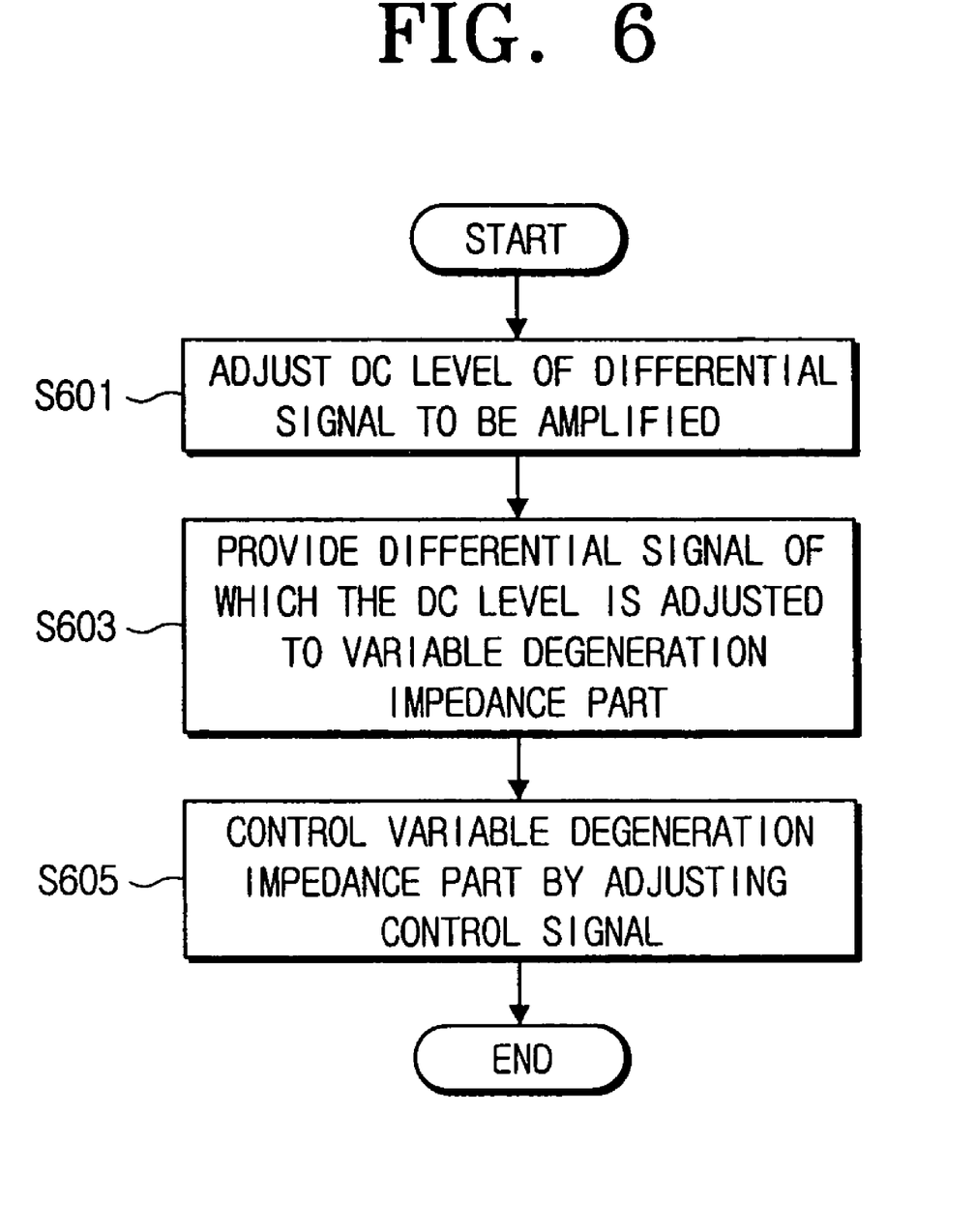
FIG. 6 is a flowchart illustrating a process of adjusting variable degeneration impedance according to an exemplary embodiment of the present invention.

FIG. 6 is a flowchart illustrating a process of adjusting variable degeneration impedance according to an exemplary embodiment of the present invention.

The process of adjusting the variable degeneration impedance will now be described with reference to FIGS. 3 and 6.

The DC level adjustment unit 305a adjusts the DC level of the differential signal to be amplified. As described above, the DC level adjustment unit 305a receives the control signal from the outside, and adjusts the DC level of the differential signal to be amplified according to the control signal (S601).

Then, the DC level adjustment unit 305a outputs the differential signal of which the DC level is adjusted to the variable impedance unit 305B (step S603).

In order to adjust the impedance of the variable degeneration impedance part 305, the control signal inputted to the DC level adjustment unit 305a is adjusted (S605).

As described above, the variable gain differential amplifier according to the present invention can adjust the amplification gain and ensure the linearity. Also, the variable degeneration impedance control device according to the present invention can adjust the amplification gain and ensure the linearity. In addition, the variable degeneration impedance controlling method according to the present invention can adjust the amplification gain and ensure the linearity.

The foregoing embodiments and advantages are merely exemplary in nature and are not to be construed as limiting the present invention. The present teaching can be readily applied to other types of apparatuses. Also, the description of the embodiments of the present invention is intended to be illustrative, and therefore it does not limit the scope of the claims. Alternatives, modifications, and variations of the exemplary embodiments described herein will be readily apparent to those skilled in the art.

What is claimed is:

1. A variable gain differential amplifier comprising:
    a variable degeneration impedance part which varies a gain of the variable gain differential amplifier by varying an impedance of the variable degeneration impedance part according to a control signal from outside; and
    a differential amplification part comprising a first terminal which receives a differential signal, a second terminal connected to a power supply through a load, and a third terminal connected to the variable degeneration impedance part;
    wherein the variable degeneration impedance part comprises:
    a DC level adjustment unit comprising an operational amplifier which adjusts a DC level of the differential signal according to the control signal; and
    a variable impedance unit where the impedance of the variable impedance unit is adjusted according to the differential signal of which the DC level is adjusted.

2. The variable gain differential amplifier as claimed in claim 1, wherein the DC level adjustment unit comprises an operational amplifier having a receiving terminal which receives the differential signal, a control signal receiving terminal which receives the control signal, and an output terminal which outputs a processed differential signal to the variable impedance unit, where the processed differential signal is produced through adjusting the DC level of the received differential signal.

3. The variable gain differential amplifier as claimed in claim 2, wherein the DC level adjustment unit further comprises a first impedance unit having one end connected to the receiving terminal of the operational amplifier and the other end connected to the first terminal of the first differential amplification part, and a second impedance unit having one end connected to the receiving terminal of the operational amplifier and the other end connected to the output terminal of the operational amplifier.

4. The variable gain differential amplifier as claimed in claim 2, wherein the variable impedance unit includes first and second transistors, wherein gate terminals of the first and second transistors are connected to the DC level adjustment unit, and drain and source terminals of the first and second transistors are connected to a third terminal of the differential amplification part.

5. A variable degeneration impedance control device for use in a variable gain differential amplifier, comprising:
    a DC level adjustment unit comprising an operational amplifier which adjusts a DC level of a differential signal to be amplified by the amplifier according to a control signal to adjust a gain of the amplifier; and
    a variable impedance unit which is connected to the DC level adjustment unit, and where the variable impedance unit adjusts the impedance of the amplifier according to the differential signal of which the DC level is adjusted;
    wherein the gain of the variable gain differential amplifier is varied by adjusting the control signal.

6. The variable degeneration impedance control device claimed in claim 5, wherein the DC level adjustment unit comprises an operational amplifier having a receiving terminal which receives the differential signal, a control signal receiving terminal which receives the control signal, and an output terminal which outputs a processed differential signal to the variable impedance unit, where the processed differential signal is produced through adjusting the DC level of the received differential signal.

7. The variable degeneration impedance control device as claimed in claim 6, wherein the DC level adjustment unit further comprises a first impedance unit having one end connected to the receiving terminal of the operational amplifier and the other end connected to a differential amplifying part, and a second impedance unit having one end connected to the receiving terminal of the operational amplifier and the other end connected to the output terminal of the operational amplifier.

8. The variable degeneration impedance control device as claimed in claim 7, wherein the variable impedance unit comprises first and second transistors, wherein gate terminals of the first and second transistors are connected to the DC level adjustment unit, and drain and source terminals of the first and second transistors are connected to a third terminal of the differential amplification part.

9. A variable degeneration impedance control method for adjusting impedance of a variable degeneration impedance part for use in a variable gain differential amplifier, the method comprising:
    adjusting a DC level of a differential signal to be amplified by the amplifier according to a control signal, wherein said DC level is adjusted using an operational amplifier,
    providing the differential signal of which the DC level is adjusted in the DC level adjustment operation to the variable degeneration impedance part; and
    adjusting the impedance of the variable degeneration impedance part by adjusting the control signal.

* * * * *